United States Patent [19]
Enami et al.

[11] Patent Number: 5,327,297
[45] Date of Patent: Jul. 5, 1994

[54] READ/WRITE AMPLIFIER CIRCUIT FOR MAGNETIC DISK UNIT

[75] Inventors: Hiroyuki Enami; Tatsuo Nishizawa, both of Tokyo, Japan

[73] Assignee: NEC Corporation, Japan

[21] Appl. No.: 790,996

[22] Filed: Nov. 12, 1991

[30] Foreign Application Priority Data

Nov. 13, 1990 [JP] Japan .................. 2-306560

[51] Int. Cl.⁵ .................. G11B 5/09; G11B 5/02
[52] U.S. Cl. .................. 360/46; 360/67; 360/66; 360/68
[58] Field of Search .......... 360/66, 67, 68, 46; 330/261, 253

[56] References Cited
U.S. PATENT DOCUMENTS 5,132,852 7/1992 Price, Jr. .................. 360/68

FOREIGN PATENT DOCUMENTS 0042705 3/1986 Japan .................. 360/66
0261804 11/1986 Japan .................. 360/67
0273609 11/1987 Japan .................. 360/68

Primary Examiner—Aristotelis Psitos
Assistant Examiner—Jennifer Pearson
Attorney, Agent, or Firm—Laff, Whitesel, Conte & Saret

[57] ABSTRACT

A read/write amplifier provides a magnetic disk unit capable of reducing variations of the bias voltage. An output stage provides a DC bias circuit for the read signal and a circuit for producing a high impedance for the read signal. A switch circuit is in a closed circuit operation only when a chip select signal is received. The output stage provides a switching order to connect a constant current circuit to the amplifier circuit at read time and to connect the DC bias circuit at the write time.

4 Claims, 2 Drawing Sheets

5,327,297

READ/WRITE AMPLIFIER CIRCUIT FOR MAGNETIC DISK UNIT

BACKGROUND OF THE INVENTION

The present invention relates to a read/write amplifier circuit of a magnetic disk unit and more particularly to a read/write circuit of a hard disk unit.

In the conventional read/write amplifier, an output of the read signal other than the reading on time is performed by the read signal output of a high impedance or an output of a constant DC current bias for the read signal output.

The conventional read/write amplifier circuit of the type mentioned has some defects to be described hereinafter with reference to FIGS. 2 and 3.

On FIG. 2, the conventional circuit has the first, second and third read/write amplifiers 27, 28 and 29, the first, second and third head coils 30, 31 and 32, the read/write switch signal input terminal 21, the first, second and third chip select input terminals 22, 24 and 26, the read signal output terminal 23, and the write data input terminal 25. The first, second and third read/write amplifiers 27, 28 and 29 each provides two amplifiers as shown in FIG. 3.

In the arrangement where the DC bias is output for the read signal output other than the read on time, when two or more read/write amplifiers are connected together as shown in FIG. 2, the DC bias is outputted even from the read signal of the unselected read/write amplifier, so that two read/write amplifiers could not be connected together.

Further, in the arrangement, the read signal output is a high impedance other than at the reading on time. An automatic gain control (hereinafter referred to as AGC) in the next stage has an extended setting-time, for example, at the time of transision from a write mode to a read mode.

The problem hereinbefore described is attributed to operation of the AGC circuit responsive to the DC voltage variation or the DC voltage difference caused when returned to the status during a read time since charges stored in the first capacitor 31 and the second capacitor 37 are discharged by the input resistor 38 of the AGC amplifier 35 when the read amplifier 34 provides a high impedance output due to the connection of the read amplifier 34 with the AGC amplifier 35 through the first and second capacitors 36 and 37 as will be appreciated from FIG. 3.

The head coil 33 is connected to the read amplifier 34, and the output 39 of the AGC amplifier is outputted from the AGC amplifier 35.

SUMMARY OF THE INVENTION

An object of the present invention is to overcome various defects as hereinbefore described and to provide a read/write amplifier circuit for a magnetic disk unit capable of reducing variations of the bias voltage.

To achieve the foregoing object, in accordance with the invention, a read/write amplifier circuit of a magnetic disk unit has an output stage where the read signal provides a DC bias circuit for the read signal and a circuit for producing a high impedance for the read signal.

The circuit for producing a high impedance is comprised of a switch circuit for a high impedance arranged between the output stage of the read signal and the read signal output terminals. The switch circuit is in closed circuit operation only when a chip select signal is received.

Further, the output stage for the read signal is comprised of an amplifier circuit for receiving signals of an induction voltage induced by a head coil, a constant current circuit and a turn switch for read time and write time. The turn switch is actuated to connect the constant current circuit to the amplifier circuit on read time to the DC bias circuit on write time.

BRIEF DESCRIPTION OF THE DRAWINGS

The invention will further be explained for embodiments with reference to the accompanying drawings in which.

PREFERRED EMBODIMENTS OF THE INVENTION

Figure 1:
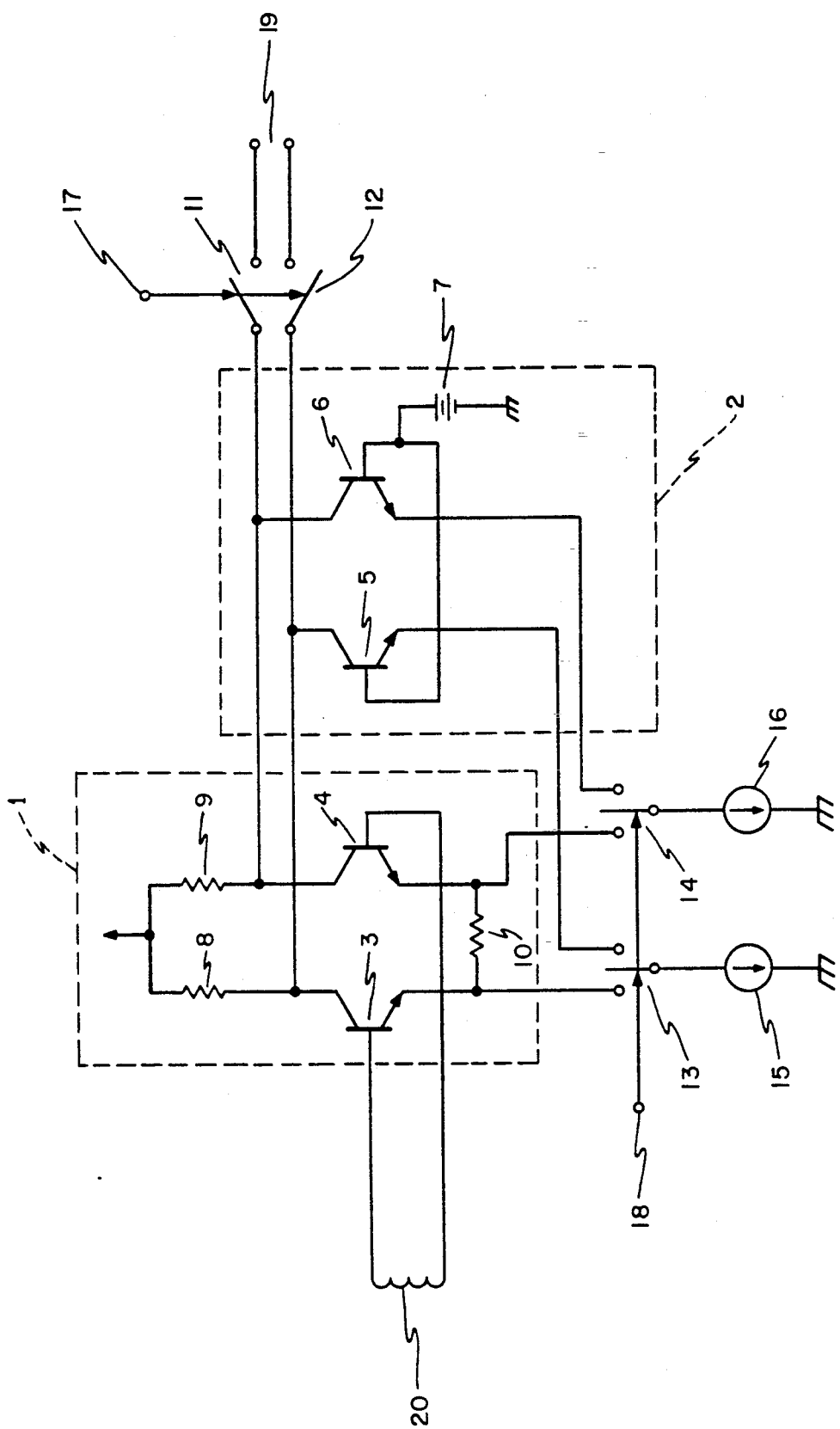
FIG. 1 is a circuit diagram showing a read/write amplifier circuit of a magnetic disk unit of one embodiment according to the present invention.
Figure 2:
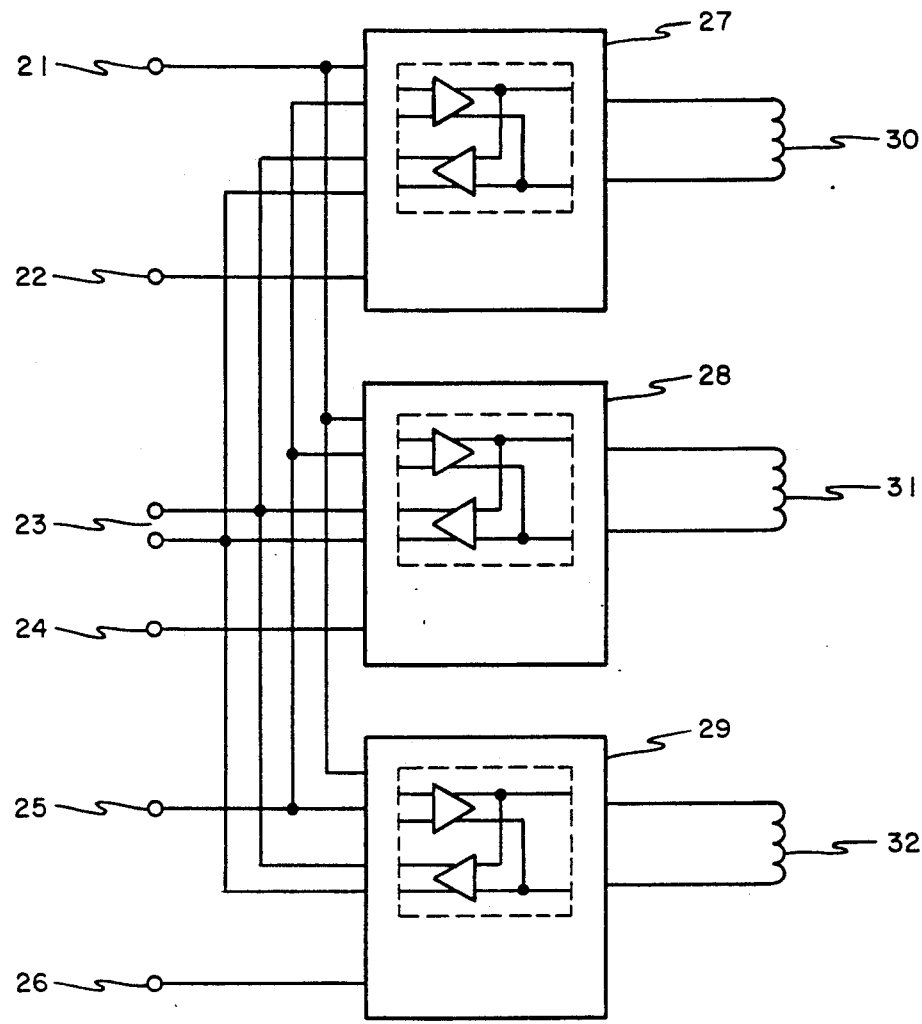
FIG. 2 is a circuit diagram where three read/write amplifiers are employed.
Figure 3:
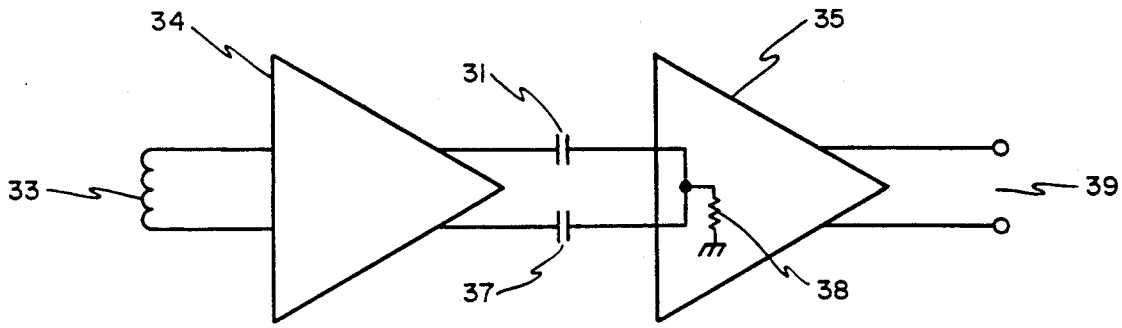
FIG. 3 is a circuit diagram showing connection of a read/write amplifier with a next stage IC.

In FIG. 1, a circuit according to the embodiment provides an amplifier circuit 1, a DC bias circuit 2, first and second switches 11 and 12, a chip select input terminal 17, a read signal output terminals 19, third and fourth switches 13 and 14, first and second constant current supply sources 15 and 16, and a read/write switch signal input terminal 18.

Further, the amplifier circuit 1 provides first and second NPN-type transistors 3 and 4, first and second resistors 8 and 9, and a third resistor 10. The DC bias circuit 2 provides third and fourth transistors 5 and 6 and a DC voltage supply source 7 connected to those transistors 5 and 6.

By the input signal from the chip select input terminal 17, the first switch 11 and the second switch 12 are turned on at read time or write time, and are turned off at times other than than read or write time. By the input signal from the read/write switch signal input terminal 18, the third switch 13 and the fourth switch 14 are turned on to the amplifier circuit 1 at the read time and are turned on to the DC bias circuit 2 at the write time.

A very small voltage induced by the head coil 20 at the read time is amplified at the amplifier circuit 1 and outputted from the read signal output terminals 19. The voltage set at the DC bias circuit 2 at the write time is outputted from the read signal output terminals 19.

When a chip is not selected, the output of the read signal output terminals 19 has a high impedance.

As hereinbefore fully described in accordance with the invention, the read signal output may have a high impedance only when the chip is not selected. Since the read signal output is biased by a constant DC voltage at the read time or write time, two or more read/write amplifiers may be connected together. Thus the bias variation upon the time of switching from the write to read status may be minimized with a shorter setting time of AGC in the succeeding stage.

What is claimed is:

1. A read/write amplifier circuit comprising an input terminal supplied with a data signal which is to be read-out, a load, a read amplifier coupled to said input terminal and said load and activated in a read mode to amplify said data signal and supply an amplified data signal to said load together with a first bias current, a DC bias circuit coupled to said load and activated in a write mode for supplying said load with a second bias current that is equal to said first bias current, said load producing in said read mode a first DC bias voltage and in said write mode a second DC bias voltage that is equal to said first DC bias voltage, an output terminal, and a switch coupled between said load and said output terminal, said switch being turned ON in said read or said write mode and turned OFF in a mode other than said read or said write mode to bring said output terminal into a high impedance state.

2. The circuit as claimed in claim 1, wherein said read amplifier includes a first transistor having a base connected to said input terminal and a collector-emitter current path connected between said load and a first circuit node and a current source producing said first bias current, and said DC bias circuit includes a second transistor having a base supplied with a base bias voltage and a collector-emitter current path connected between said load and a second circuit node, said read amplifier further including a switching circuit for connecting said current source to said first circuit node in said read mode and to said second circuit node in said write mode, said second transistor supplying said first bias current to said load as said second bias current.

3. A read/write amplifier circuit for a magnetic disk unit, said circuit comprising first and second input terminals connected with a coil therebetween, a first transistor having a base connected to said first terminal and a collector-emitter current path connected between first and second nodes, a second transistor having a base connected to said second input terminal and a collector-emitter current path connected between third and fourth nodes, a load circuit connected between said first and third nodes, means for coupling said second and fourth nodes, a third transistor having a base connected to a bias voltage source and a collector-emitter current path connected between said first node and a fifth node, a fourth transistor having a base connected to said bias voltage source and a collector-emitter current path connected between said third node and a sixth node, first and second bias current sources, a first switching circuit for connecting said first bias current source to said second node in a read mode and to said fifth node in a write mode, a second switching circuit for connecting said second current source to said fourth node in said read mode and to said sixth node in said write mode, first and second output terminals, a third switching circuit connected between said first node and said first output terminal, and a fourth switching circuit connected between said third node and said second output terminal, said third switching circuit being turned ON in said read or write mode and turned OFF in a mode other than said read or write mode, and said fourth switching circuit being turned ON in said read or write mode and turned OFF in said mode other than said read or write mode.

4. The circuit as claimed in claim 3, wherein said load circuit comprises a first resistor connected between said first node and a power terminal and a second resistor connected between said third node and said power terminal and said coupling means comprises a third resistor connected between said second and fourth nodes.

* * * * *